(12) United States Patent
Pradhan

(10) Patent No.: US 6,781,456 B2
(45) Date of Patent: Aug. 24, 2004

(54) FAILSAFE DIFFERENTIAL AMPLIFIER CIRCUIT

(75) Inventor: Pravas Pradhan, South Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/292,119

(22) Filed: Nov. 12, 2002

(65) Prior Publication Data

US 2004/0090265 A1 May 13, 2004

(51) Int. Cl.$^7$ .......................... H03F 3/45; H03K 19/007
(52) U.S. Cl. .......................................... 330/69; 326/14
(58) Field of Search ............................ 330/69; 326/14; 327/64, 205

(56) References Cited

U.S. PATENT DOCUMENTS 5,065,047 A * 11/1991 Igari et al. ..................... 326/14
6,320,406 B1 * 11/2001 Morgan et al. ................ 326/14
6,462,589 B2 * 10/2002 Taylor ........................ 327/108

* cited by examiner

Primary Examiner—Khanh Van Nguyen
(74) Attorney, Agent, or Firm—Cesari and McKenna, LLP; Edwin H. Paul, Esq.

(57) ABSTRACT

Differential input fail safe circuitry is disclosed that detects missing or too low differential signals combined with a frequency lower than a frequency limit where a final safe condition is detected and signaled. The output signal form the fail safe circuitry is held in a given state that is an invalid representation of the differential input signal. A frequency detector, complementary offsetting auxiliary amplifiers with limit frequency roll offs are used to detect the fail safe condition. In addition a delay circuit is used that requires the fail safe condition to exist for some time before the fail safe circuit is active. Initialization circuitry ensures a proper power up conditions where the circuitry is enabled to detect the fail safe conditions and guarantees a reliable fail safe irrespective of the previous state of the signal.

6 Claims, 15 Drawing Sheets

FAILSAFE DIFFERENTIAL AMPLIFIER CIRCUIT

BACKGROUND OF THE INVENTION

1. Field of the Invention

The present invention relates to logic differential amplifier circuits, and more particularly to such receivers incorporating fail-safe circuitry.

2. Background Information

Fail safe differential amplifiers or receivers provide a known output when an indeterminant or invalid input signal is present at the inputs. An invalid input signal generally occurs when the inputs are floating or three-stated, or shorted. But partial shorts or opens may lead to invalid input signals. In the face of such invalid input signals the receivers usually will oscillate, switch on noise or will be in an indeterminant state.

Prior solutions have provided bias resistors at the inputs of the differential receiver to bias the inputs to a known condition by providing a dc offset at the inputs. But, such an offset may unbalance return currents, distort the output and possibly load and reduce the input signal amplitude. Other solutions have biased the inputs of the receiver to Vcc with logic to drive the receiver output to some known state.

Another solution is found in Texas Instruments differential receiver, part no. SN65LVDT32B, and several other similar devices. The circuit of this device provides two active circuit high impedance comparators sharing the receiver inputs. These comparators provide a window with one comparator providing a +80 millivolt threshold and the other a −80 millivolt threshold. A fail-safe timer is "anded" with the comparator outputs and if the differential input is within the +/−80 millivolt window at the end of the timer period, the output is driven to a known fail safe high state. One limitation of this circuit is that the fail safe timer must switch to start the time period. If the input to the receiver is valid, say more than +80 millivolts differential, but then reverts to an invalid state, say +10 millivolts differential, the timer may not be started since the receiver output may not switch.

Another fail safe device is produced by Maxim, part no. MAX9153/4. This device is labeled as a repeater, but in fact is a differential amplifier or receiver circuit. This circuit has diode spike suppressors and may not operate when powered up with the transmission line shorted, or with low level (under 100 millivolt) attenuated differential signals. High frequencies operation may be also impaired.

The objective of this invention is to provide an active failsafe circuit that takes the output of the receiver to a known state if any of the following is true.

1. Input differential signal attenuates below a defined threshold.
2. Input differential signal collapse to 0Volt (cable shorted, line shorted, wire shorted, etc.)
3. Input differential signal goes to an un-driven, un-known state or floating inputs. (cable open, device not connected to system, etc.)

It is another objective of the present invention to provide an active fail safe circuit receiver that does not load or degrade the input signal or degrade the balance, or the dynamic range or quality of the input or output of the receiver. It is another objective to provide a fail safe receiver that operates over the entire input common-mode range and assures a known output state in the presence of common mode noise, dc bias and/or system ground offsets. It is another objective of the present invention to not affect the high frequency performance of the receiver.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

SUMMARY OF THE INVENTION

The foregoing objects are met in a failsafe circuit for a differential amplifier/receivers that employs offset auxiliary amplifiers that measure the amplitude of the input differential (Vid) signal to an offset voltage, and also to measure if the frequency component of the Vid is less than a frequency limit. A separate frequency detector measures the frequency of the Vid, and a logic circuit accepts signals from the auxiliary amplifiers and the frequency detector. If the amplitude of the Vid is less than the offset voltage and the frequency is less than the limit a fail safe condition exists and the output is forced to a given state that does not follow the Vid signal. If the amplitude is greater than offset voltage or the frequency is greater than the frequency limit, the fail safe circuit is inactive and the output follows the Vid. In a preferred embodiment a time delay and an initialization circuit are implemented. In a preferred embodiment a startup circuit, a memory element and delay element and some logic elements are used for control.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
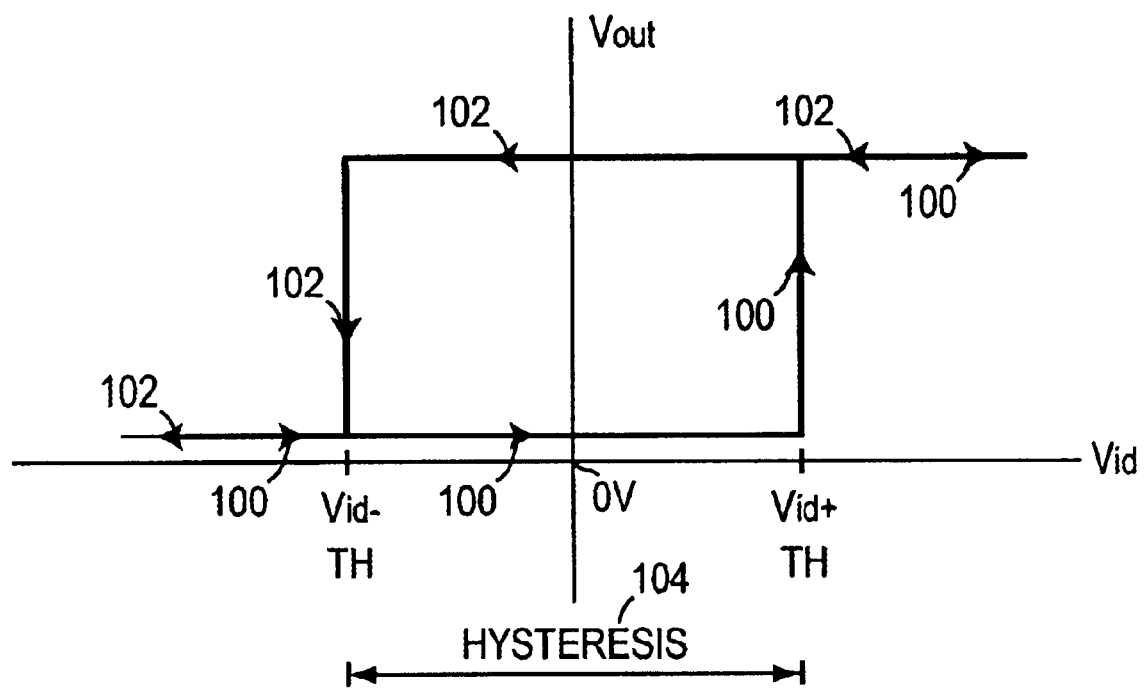
FIG. 1 is a an input/output hysteresis chart for a typical differential receiver.

FIG. 1 shows a basic hysteresis curve found in virtually all differential signal receivers. The horizontal axis represents a positive going differential signal, Vid, and the vertical axis represents the output signal going from 0 to +Vcc. A negative differential signal starting at 100 increases until Vid+ threshold is reached whereupon the output goes high. The Vid then might travel negative 102 with the output remaining high until the Vid− threshold is reached whereupon the output goers low. The difference between the Vid+ and the Vid− is the hysteresis 104 built into the circuit. The need for hysteresis is due to the differential input sensitivity of the amplifier. Without hysteresis an amplifier cannot accurately decide the state of a signal if it falls within the input sensitivity region. There is also a possibility of amplifier becoming unstable and oscillating if a signal remains in this undefined region. It is possible to add an additional hysteresis by design to further increase the undefined area.

It is also possible to design an amplifier which switches states only when the signal is outside of this undefined region, either positive or negative, thereby eliminating the possibility of oscillations.

The inventive approach is to monitor the input signal amplitude and frequency continuously. The low frequency case and the DC case are distinguished as discussed below.

Figure 2:
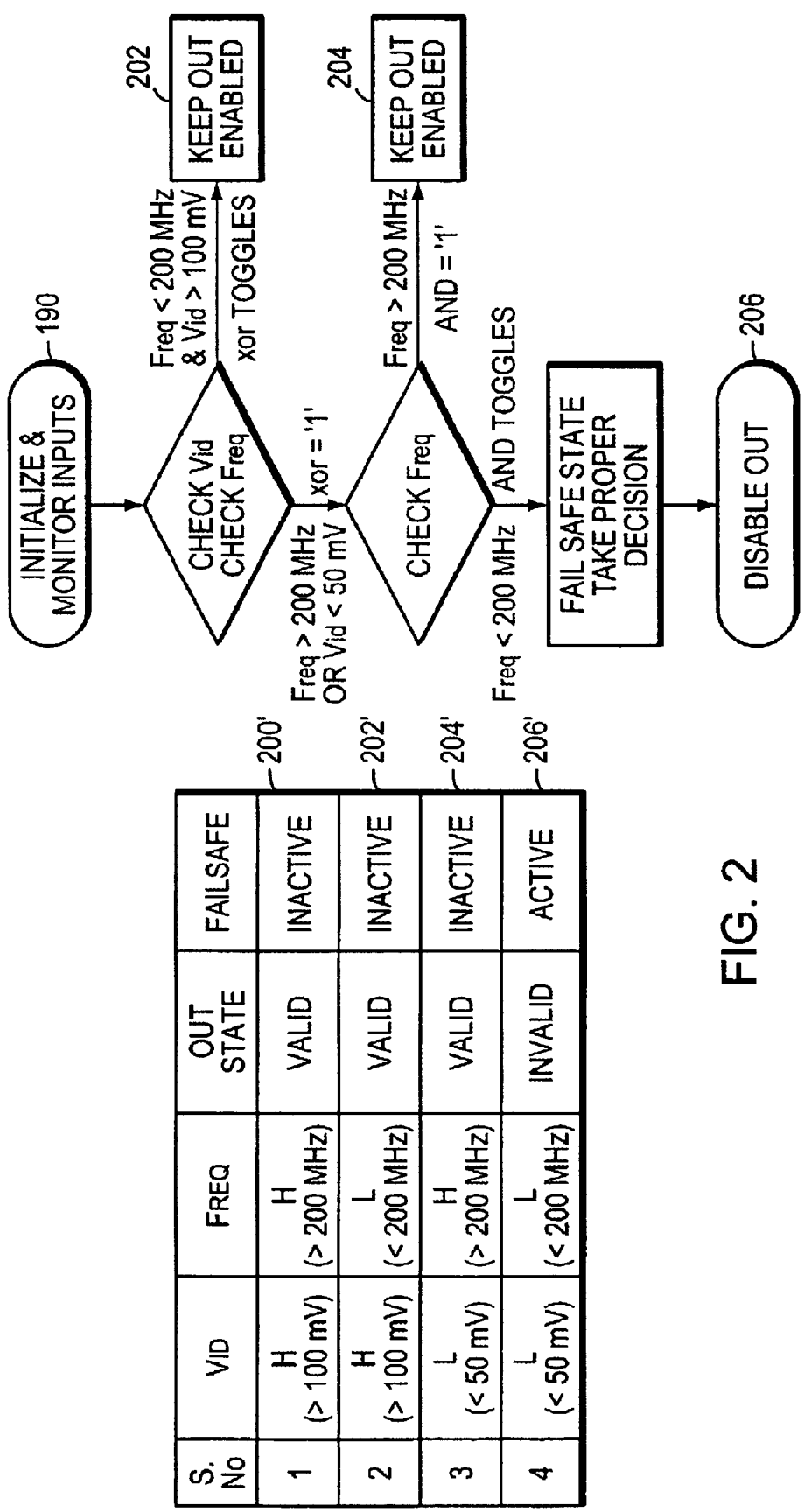
FIG. 2 is a truth table and logic flow chart for a preferred embodiment of the present invention.

The FIG. 2 flow chart begins with an initialization 190 of the circuitry embodying the present invention. The differential input voltage, Vid, is measured for magnitude and frequency as described later. If the magnitude is greater than 100 mV and the frequency is less than 200 MHz, failsafe circuit detects it and keeps the control signal (en_in) enabled and thus a normal output from the differential receiver is provided. This state is equivalent to the first row in the truth table 200'.

If the frequency is less than 200 MHz but the Vid is greater than 100 mV fail-safe circuit detects it and keep the control signal (en_in) enabled and thus a normal output from the differential receiver is provided 202. In this state "xor" will toggle, as described later. This is shown in the second row 202' of the truth table.

If the frequency is greater than 200 MHz and the Vid is less than 50 mV the state as in the third row of the truth table 204' is assumed. Here the "AND" signal is true as later described and the failsafe is disabled 204. The failsafe circuit detects it and keeps the control signal (en_in) enabled and again a normal output from the differential receiver is provided.

However, when the Vid is less than 50 mV and the frequency is less than 200 MHZ, the "AND" will toggle. The failsafe circuit detects it and after a delay the control signal (en_in) is disabled. In this state the output of the differential receiver is invalid 206 as shown in the fourth row of the truth table 206'.

Figure 3:
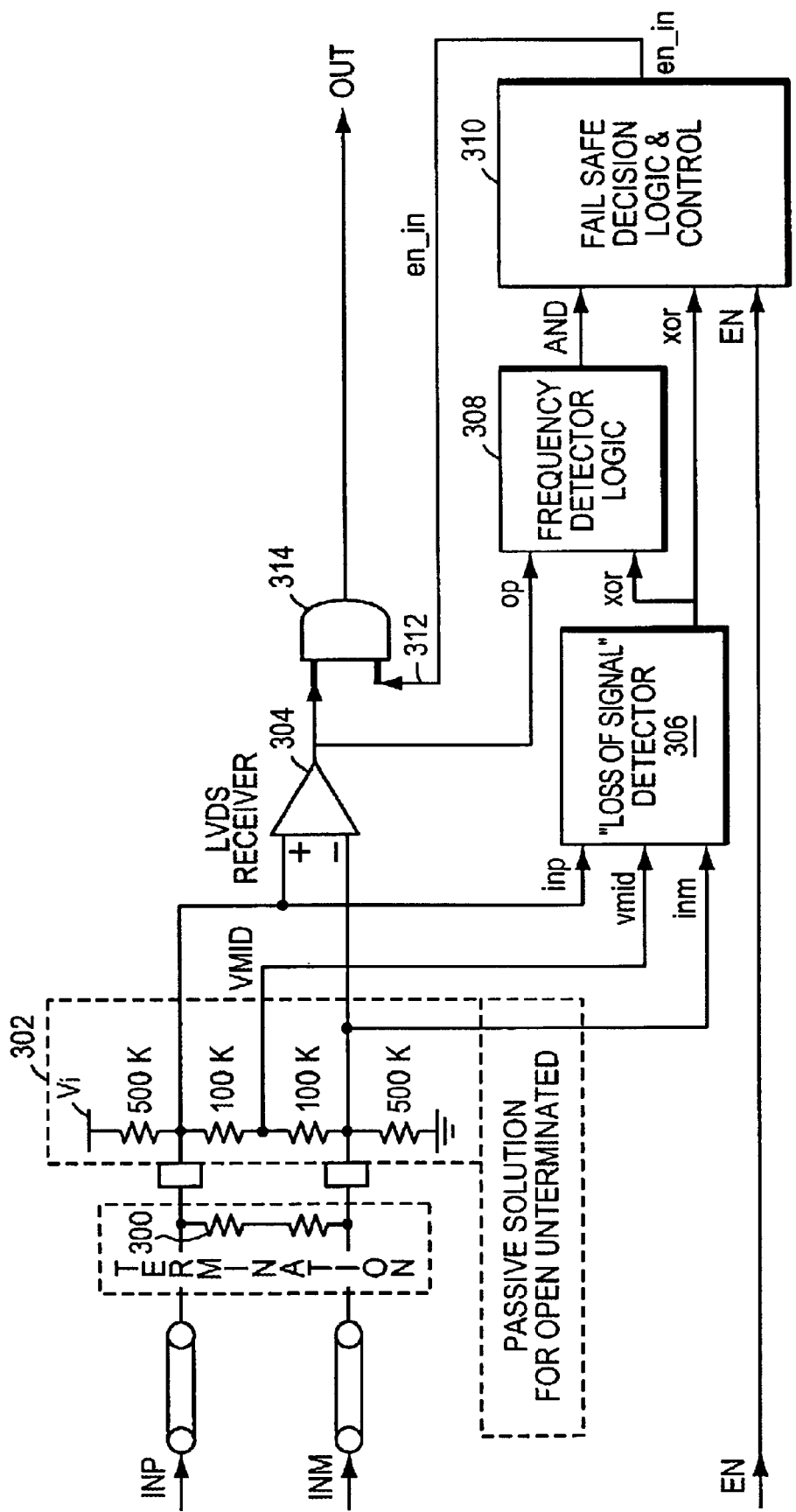
FIG. 3 is a schematic/block diagram illustrating an embodiment of the present invention.

FIG. 3 is a circuit schematic/block diagram of a preferred embodiment of the present invention. An input differential signal appears between INP and INM and a termination resistor 300 may be provided to match a transmission line impedance. A high value resistor network 302 is provided with high values to meet some of the design specification set by current requirements and to satisfy one of the failsafe conditions. More specifically, the failsafe operation during open and undriven inputs. The resistor network 302 is arranged between a power supply voltage V1 and the ground return. The differential input signal is connected to input connections of the LVDS—a high speed differential amplifier 304. The VMID is a bias output set to a nominal value equal to one half of the supply voltage V1 under open, undriven conditions, otherwise this node provides the common mode voltage of the input differential signal with respect to receiver's ground.

The LVDS Receiver is a high speed, high gain, differential amplifier with rail to rail input common mode range that is common in the art. Most such amplifiers or receivers have about 10 mV sensitivity from DC to 1 GHz.

In this instance, the fail-safe function will be active when the drivers supplying the differential input signal are turned off or three-stated, the input cable is damaged creating shorts or opens, or other such conditions where, in effect, there is no input signal and the LVDS receiver switches on noise or oscillates. A failsafe condition also exists if the input signal drops down to a threshold limit, in this case 50 mv, due to various voltage level attenuations of the input signal before reaching the receiver inputs. If there is no connection to the driving circuitry an INP or INM the terminating resistor 300 (of 50 to 100 or so ohms) will effectively create a short circuit between INP and INM, which is equivalent to same failure condition as shorting the inputs together.

The resistor network 302 provides three signals IN+, IN−, and VMID 8, that are processed in a "loss of signal" detector 306. The IN+ and IN− are same as the input signals INP and INM respectively while VMID gives the common mode value. Here common mode is extracted to reduce the net differential signal on the auxiliary amplifiers by half i.e. instead of INP−INM we will have now INP−VMID at the input of auxiliary amplifier A1. By doing this we can reduce the requirement of the total built in offset voltage on A1 and A2 by half, i.e., A1 and A2 need to have only 25 mV input offset. Since built in offset effects the bandwidth, by doing this we effectively double the bandwidth. In an alternate arrangement, one might take directly INP and INM to A1 and A2, thereby eliminating the need of Vmid. There can be other ways also to extract the common mode value from the input signal and the resistive network is just an example to how to do it. Another example can be a common mode feedback circuit and people in this trade are aware of many more such techniques which are not listed here. The key is to have a circuit there which can give the common mode input voltage. Two additional modules, a Frequency Detector 308 and a Fail Safe Decision Logic and Control 310 are discussed below. The output of these modules is an en_in signal 312 that goes low when the Fail Safe function is active. The low en_in signal via the AND gate 314 forces the OUT signal to be low irrespective of the output from the LVDS 304. In normal conditions the en_in signal is high and the OUT signal follows the output of the LVDS which, in turns, follows the input differential voltage Vid.

Figure 4:
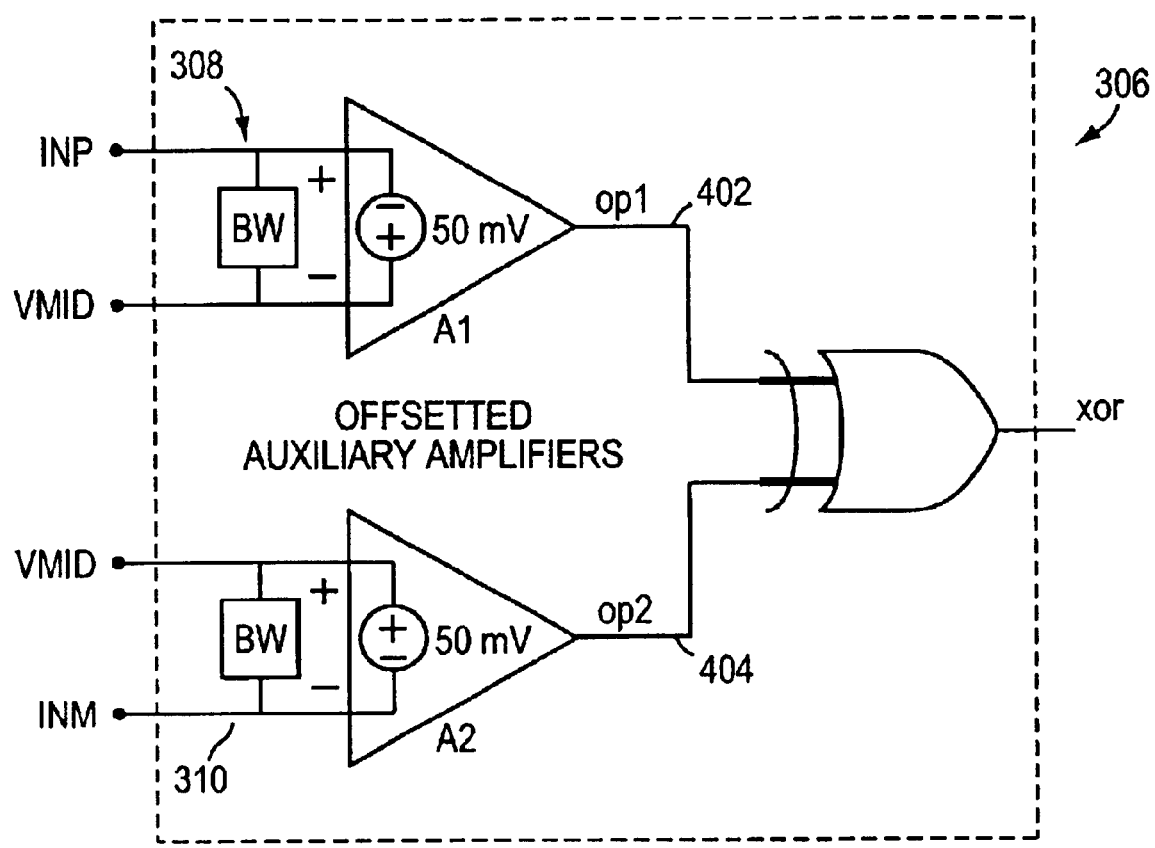
FIGS. 4, 5 and 6 a schematic block diagram of the modules shown in FIG. 3, and FIGS. 7–15 are time logic diagrams of the signal shown in the schematic block diagram.

FIG. 4 is a schematic of the Loss of Signal Detector 306. The 50 mV sources in each offsetted auxiliary amplifiers A1 and A2 represents a built in voltage offset (50 mV in each case with respect to input Vid) in each auxiliary amplifier that must be overcome by the differential input signal, INP−INM which is same as Vid, or a fail safe state exists except where the frequency is greater than 200 MHz, as discussed below. As evident from the schematic this module monitors the input for a loss of amplitude or an increase in frequency of the input signal.

The offsets, as seen from the schematic, are arranged in opposite directions. If there is a loss of signal, say the input Vid is switching from +50 mV to −50 mV (or less) at low frequencies, the xor output will not switch. In this case op1 will be low because the INP never becomes high enough to overcome the 50 mV offset, and op2 will be high. Here the xor output will remain high. When xor is high a fail safe condition may exist since the input voltage signal is beneath the 50 mv threshold.

To restate the conditions from FIG. 2, if xor goes high a fail safe condition may exist, but if the Vid is +/−100 mv or if the frequency is greater than 200 MHz there will not be a fails safe condition. The fail safe condition will be active only when the Vid is less than +/−50 mv and the frequency is less than 200 MHz. As discussed below, the fails safe will occur when xor is high and the AND signal toggles.

In FIG. 2 the INP−INM or Vid must be higher than the offset in order to have A1 and A2 respond as a non-fail safe condition.

At a frequency less than 200 MHz, Vid square wave of +/−50 mv, when INP is less than 25 mV higher than VMID, op1 will be low, and when INM is less than 25 mV lower than VMID, op2 will be high. In this case the output, "xor" will be high and a fail safe condition may exist. Regardless of frequency (except with respect to edge rates as discussed below), when Vid is square wave of +/−100 mv, the INP is more than 25 mV higher than VMID and INM is more than 25 mV lower than VMID op1 and op2 will toggle and thus "xor" will toggle, but the fail safe circuit will never be active.

Low pass filter networks 308 and 310 are shown in the input arms of the offsetted auxiliary amplifiers. These are representative of frequency roll off characteristics of each of the auxiliary amplifiers wherein, if the VID is greater than 200 MHZ, A1 and A2 will not pass the signal. If Vid is 100 mv or 50 mv, xor will be high but the OUT will still follow the Vid as described below. Practitioners in the art can appreciate that the roll off cannot be a step function from 50 mV to 100 mV. Thus it is easy to guarantee that a good input should be more than 100 mV and a bad input should be less that 50 mV. Anything in between cannot be guaranteed as a valid input signal.

Figure 5:
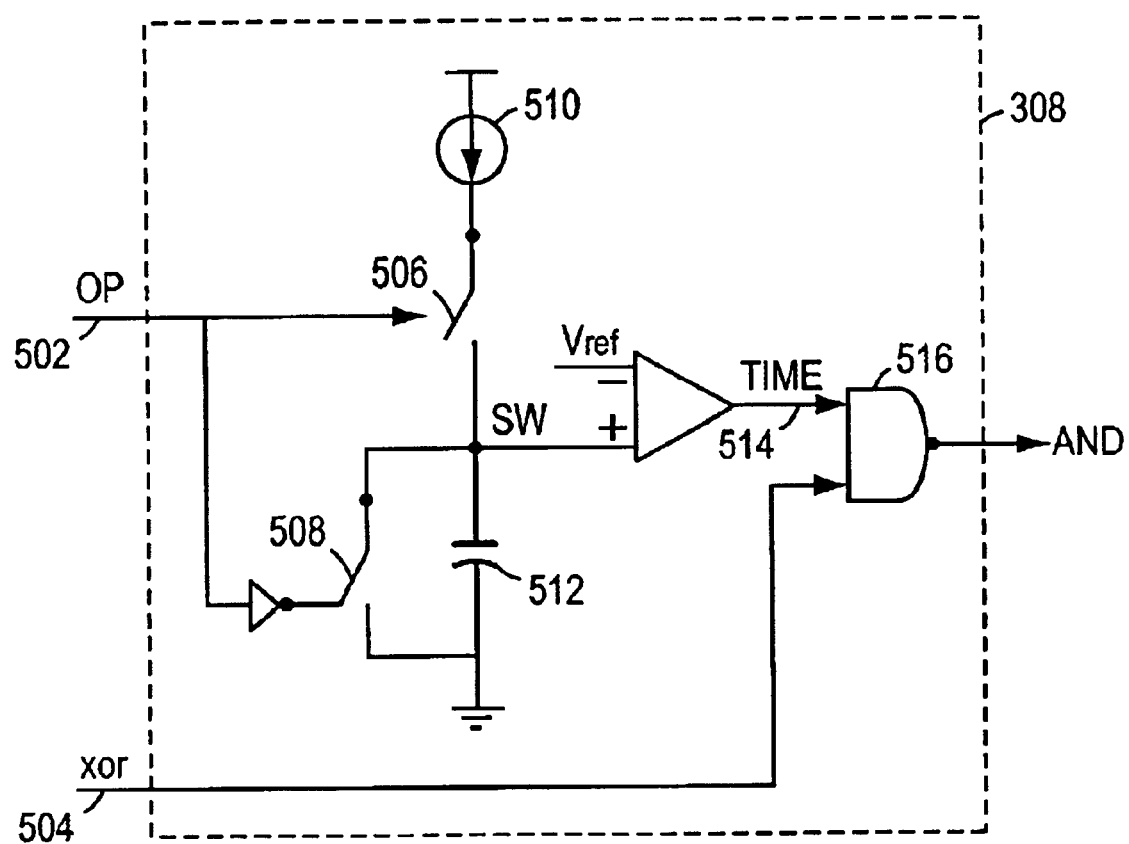

FIG. 5 is the Frequency Detector Logic that accepts inputs OP 502 from the LVDS amplifier 304 and xor 504 from the Loss of Signal Detector 306. As illustrated the circuit is conceptually a switched capacitor that takes the OP signal and outputs an AND signal. that indicates a low frequency or high frequency input signal, with 200 MHz being the frequency distinguishing one from the other. A distinction between low frequency and DC is resolved in the Fail Safe Decision logic and Control 310. The OP signal toggles corresponding to a Vid. That signal connects and disconnects the switches 506 and 508 allowing the current source 510 to charge and discharge the capacitor 512. The rate of charge is a function of the values of the current source, the capacitor value and the frequency of the input signal. If xor is high and the input signal is about 50 mv at less than 200 MHz, the AND signal will toggle. Gate 516 is a NAND gate where the AND signal will be low only when both time 514 and xor are both high, or AND will go high when either time 514 or xor 504 or both are low. The Vref and the circuit parameters will allow the SW signal on the capacitor to get to the Vref trigger point. This toggling time 514 signal will result in activating the Fail Safe where the OUT signal is not valid.

In the case where the frequency is greater than 200 Mhz and the Vid is=+/−50 mv the circuit parameter will prevent the SW signal from reaching the Vref switching threshold and the AND signal will not toggle. This will not activate the Fail safe condition. Where the frequency is greater than 200 MHz and Vid is +/−100 mv, the Vref threshold will be reached but the xor signal will toggle, the AND signal is ignored and the Fail Safe is not activated.

Figure 6:
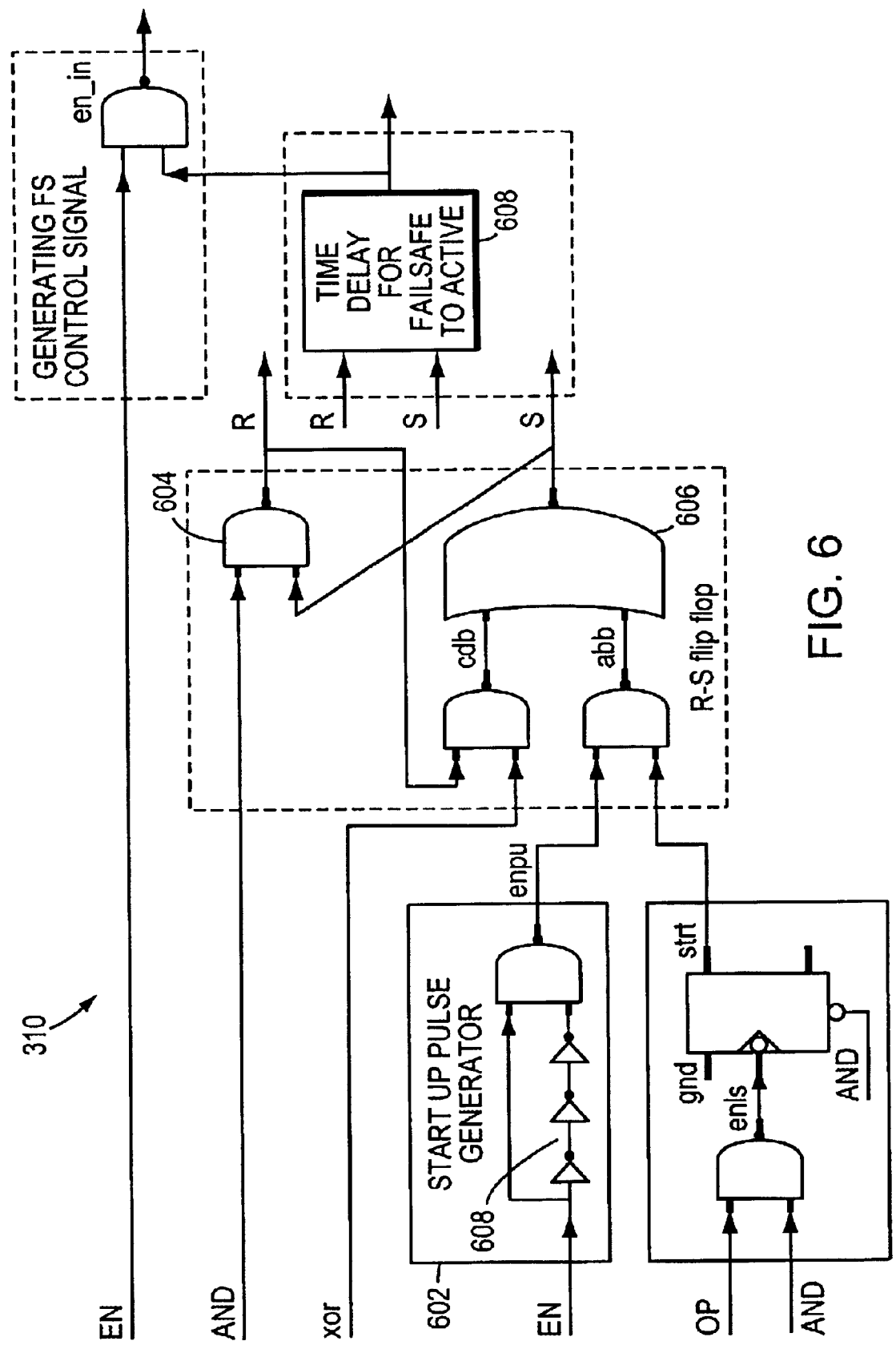

FIG. 6 includes a pulse generator 602 that sets the cross couple RS gates 604 and 606—signal S goes high. This provides the required initialization to the RS flipflop when the receiver is just enabled. The three inverters 608 create a delay so that when EN, and initialization signal that remains high, goes high enpu goes low for the time it takes EN to travel through the three inverters 608 whereupon enpu goes back high. After the initialization, the circuit is set to detect a fail safe condition. When detected RS flop is reset where S goes low. A delay circuit 608 delays any fail safe determination by the time delay 608. If a fail safe condition occurs, it may be reset unless it exists for the time delay 608.

Figure 7:
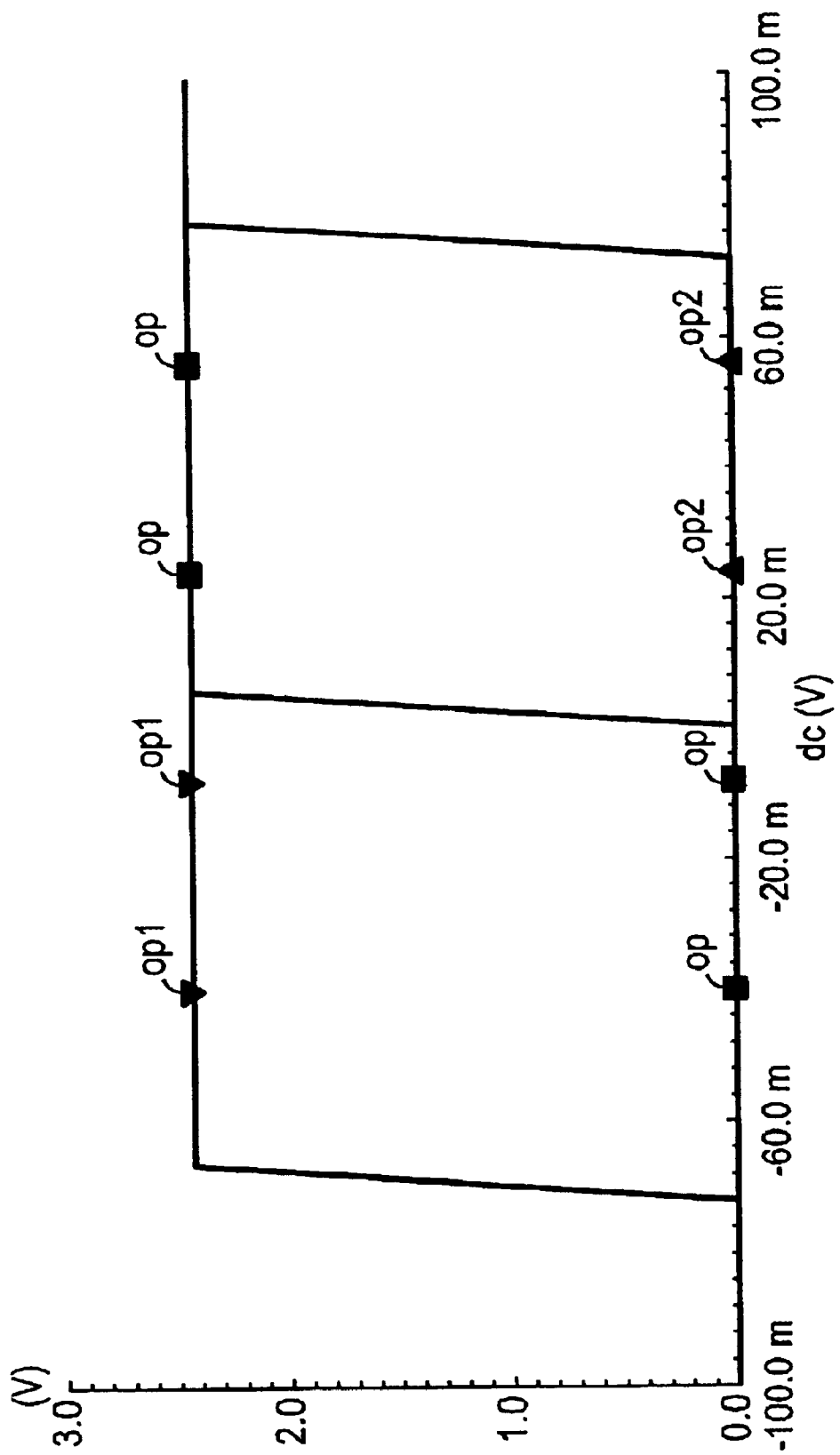
Figure 8:
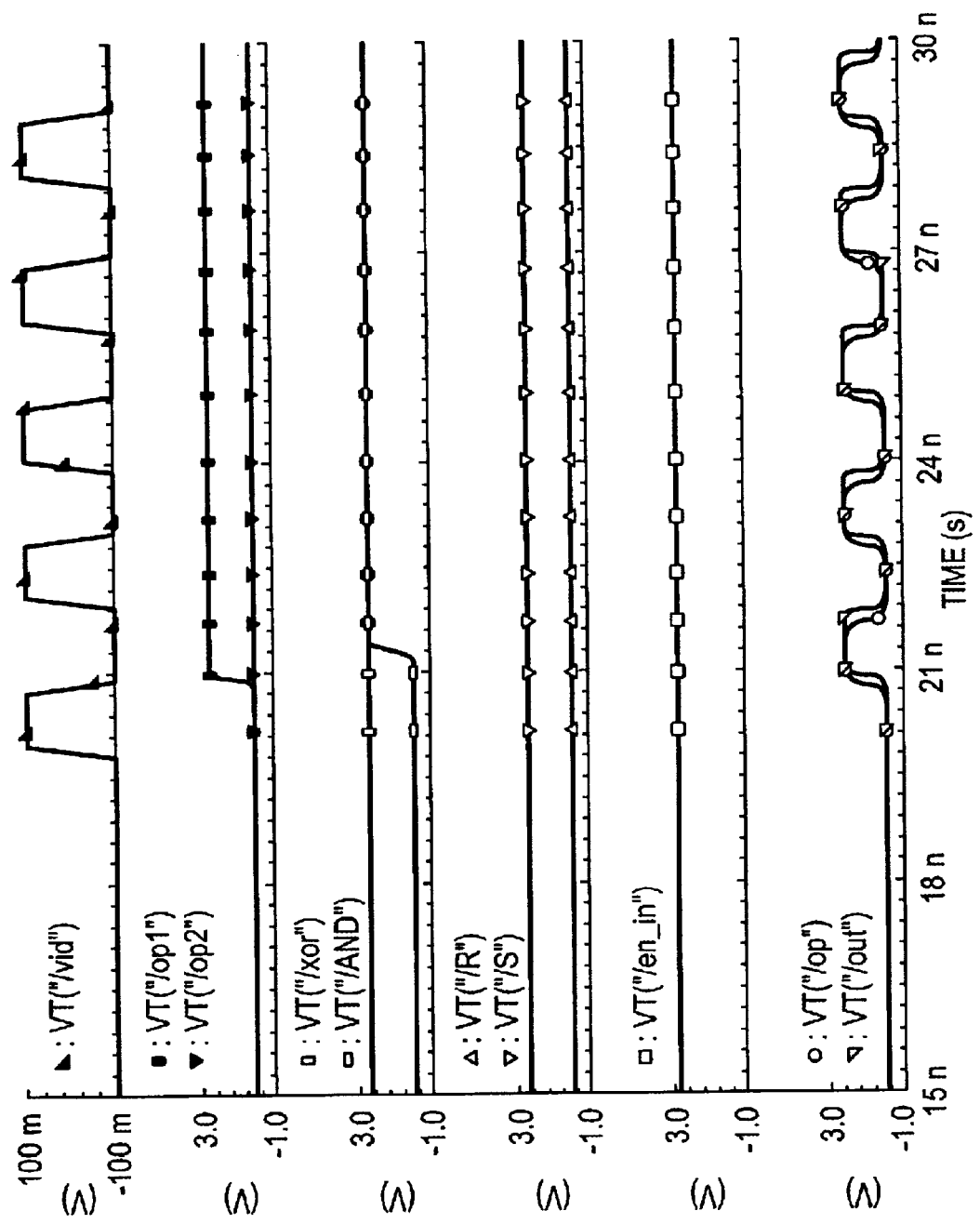
Figure 9:
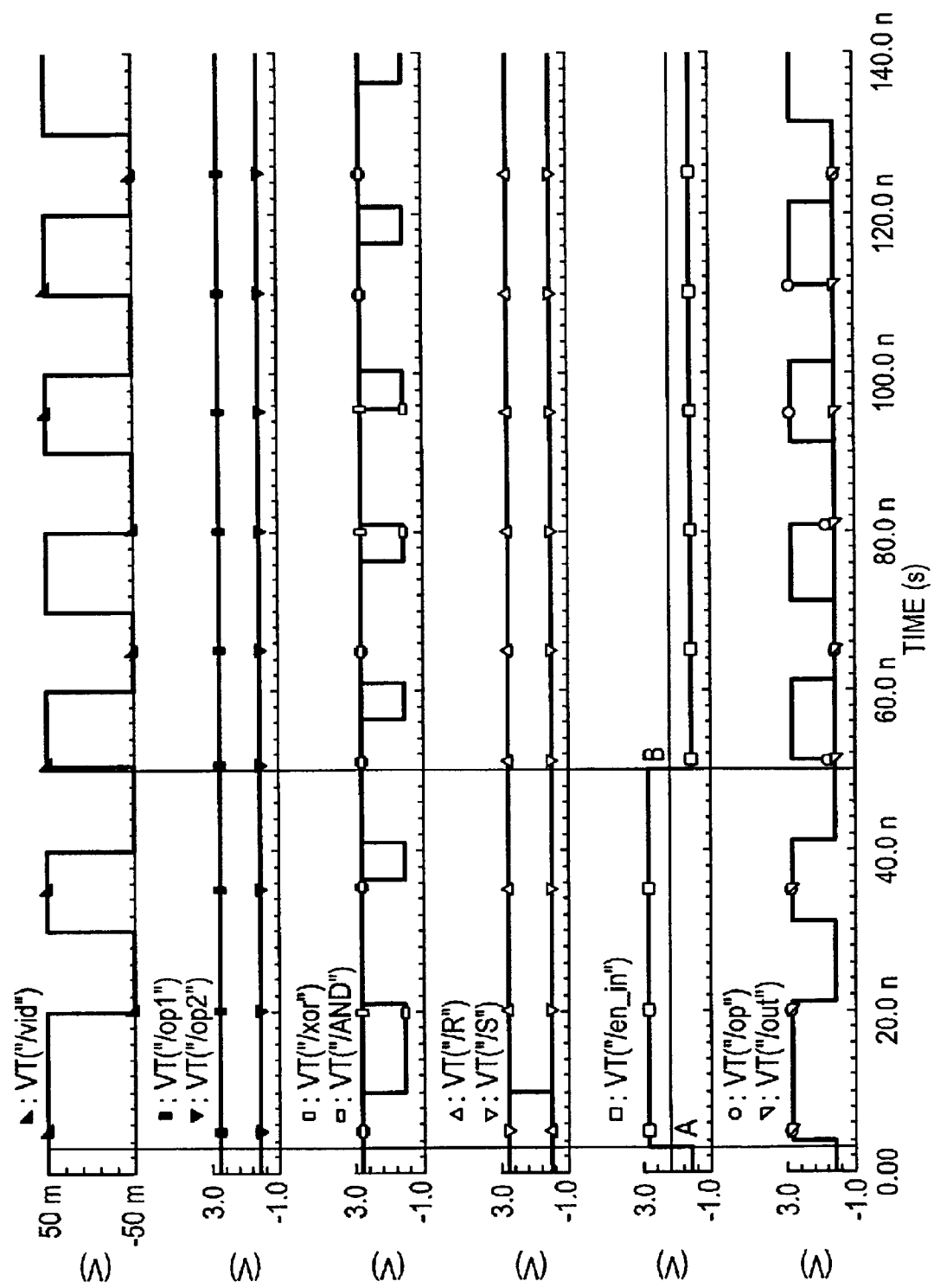
Figure 10:
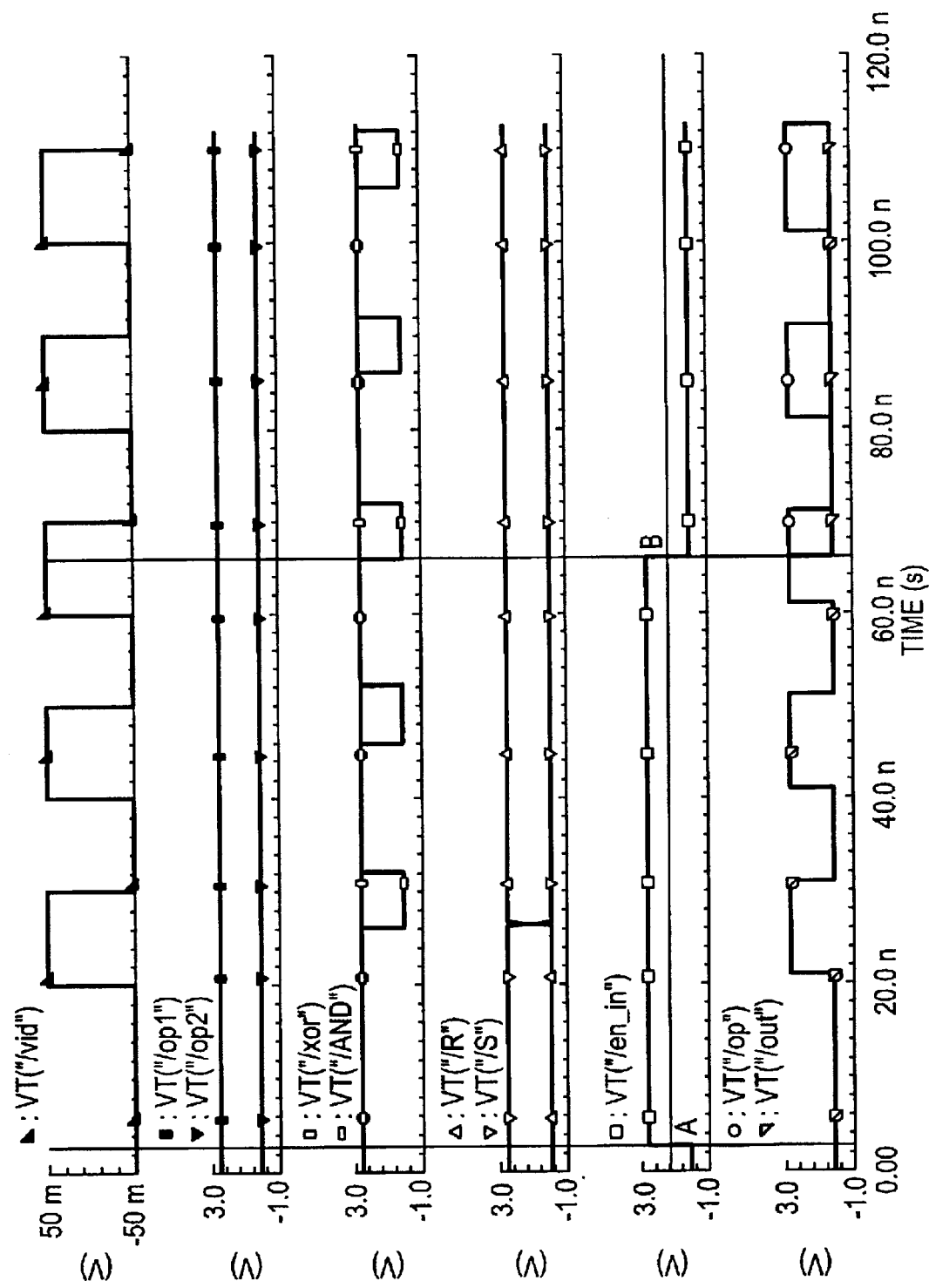
Figure 11:
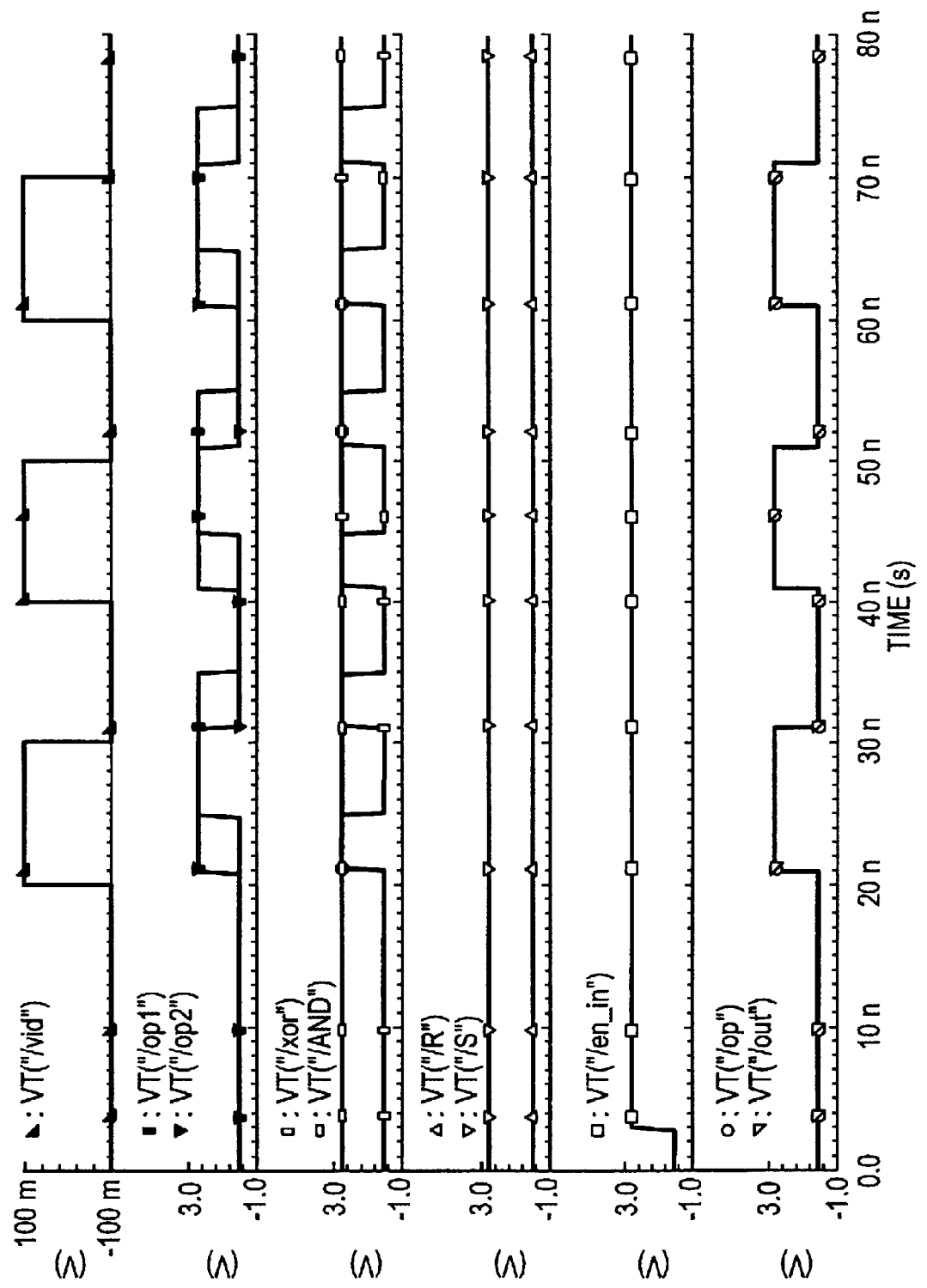
Figure 12:
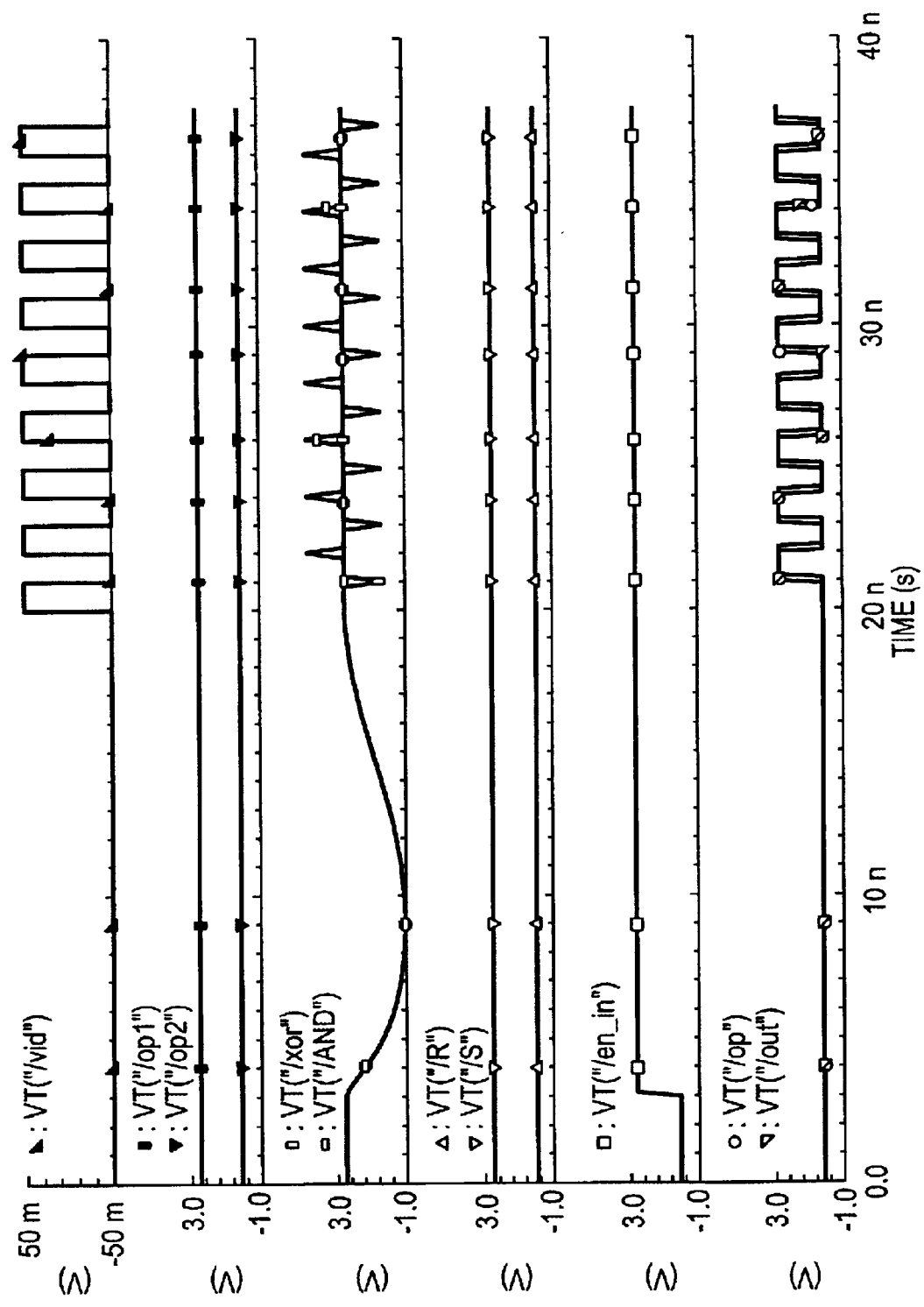

FIG. 7 shows the signal OP, the output of the LVDS 304 and the outputs of A1 (op1) and A2 (op2) indicating the offset of something more than the 50 mv. FIGS. 8, 9, 10, 11, 12, 13, 14 and 15 shows the various states and the logic signals of the circuit FIGS. FIGS. 9 and 10 show the FailSafe condition. FIG. 8 shows Vid of 100 mv, a freq. of 500 MHz, op1 high, op2 low, where OUT follows Vid. FIG. 9 shows Vid of 50 mv, a freq. of 100 MHz, op1 high, op2 low, where OUT is held high—a fail safe state. FIG. 10 shows the same conditions of FIG. 9 except the with Vid coming from the opposite direction. FIG. 11 shows Vid of 100 mv, a freq. of 100 MHz, op1 and op2 toggle, and OUT follows Vid. FIG. 12 shows Vid of 50 mv, a freq. of 500 MHz, op1 is high, op2 is low, and OUT follows Vid.

Figure 13:
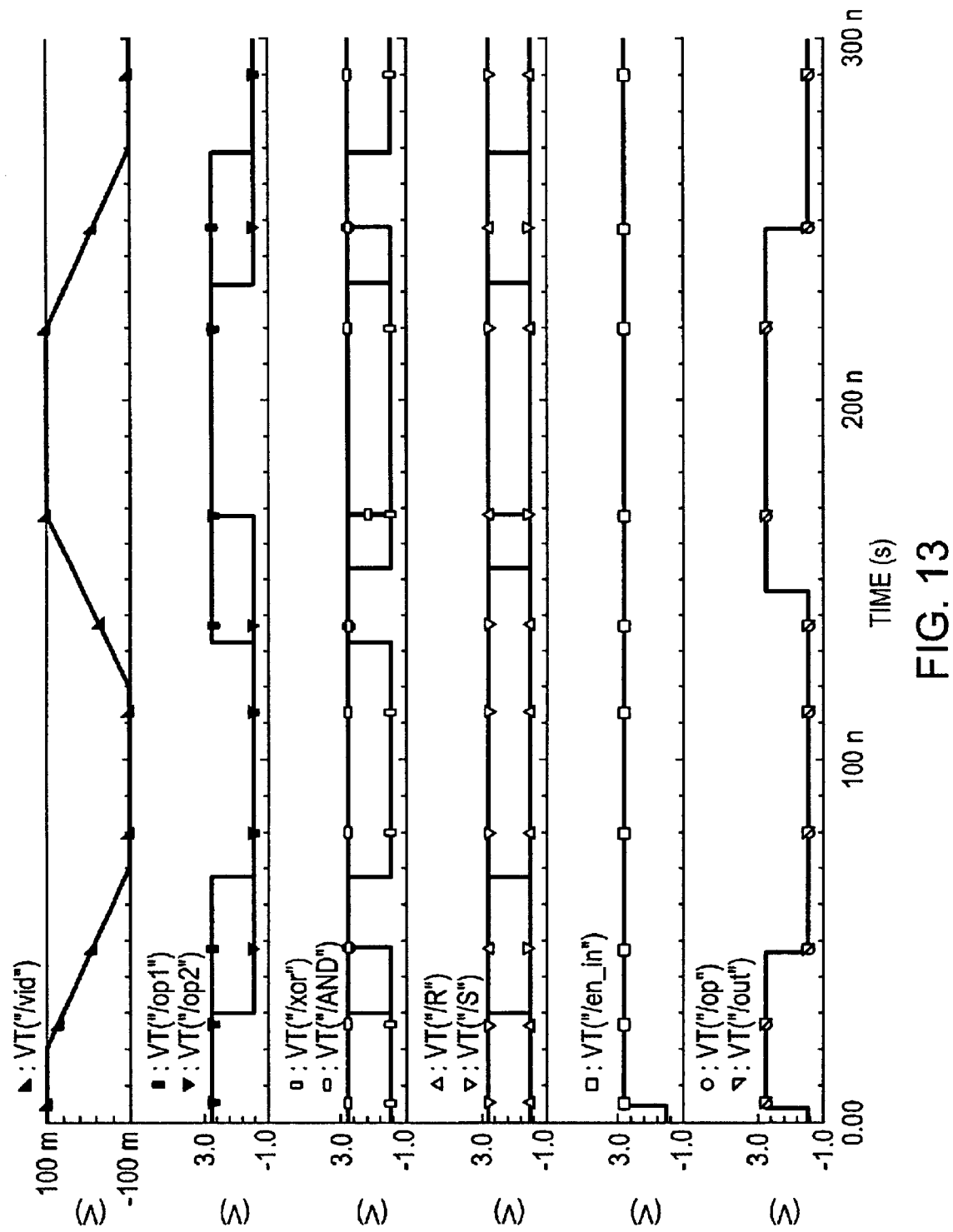
Figure 14:
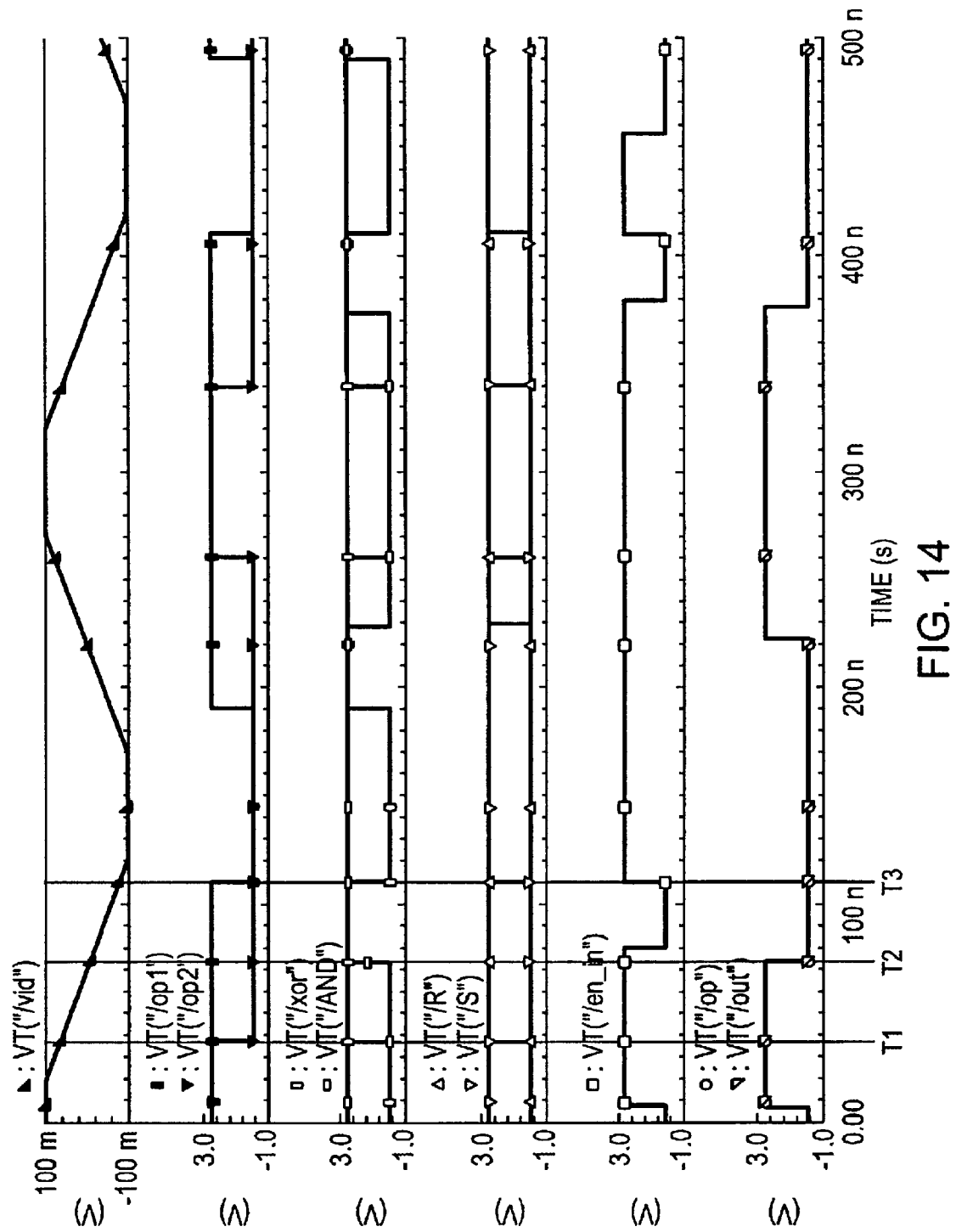
Figure 15:
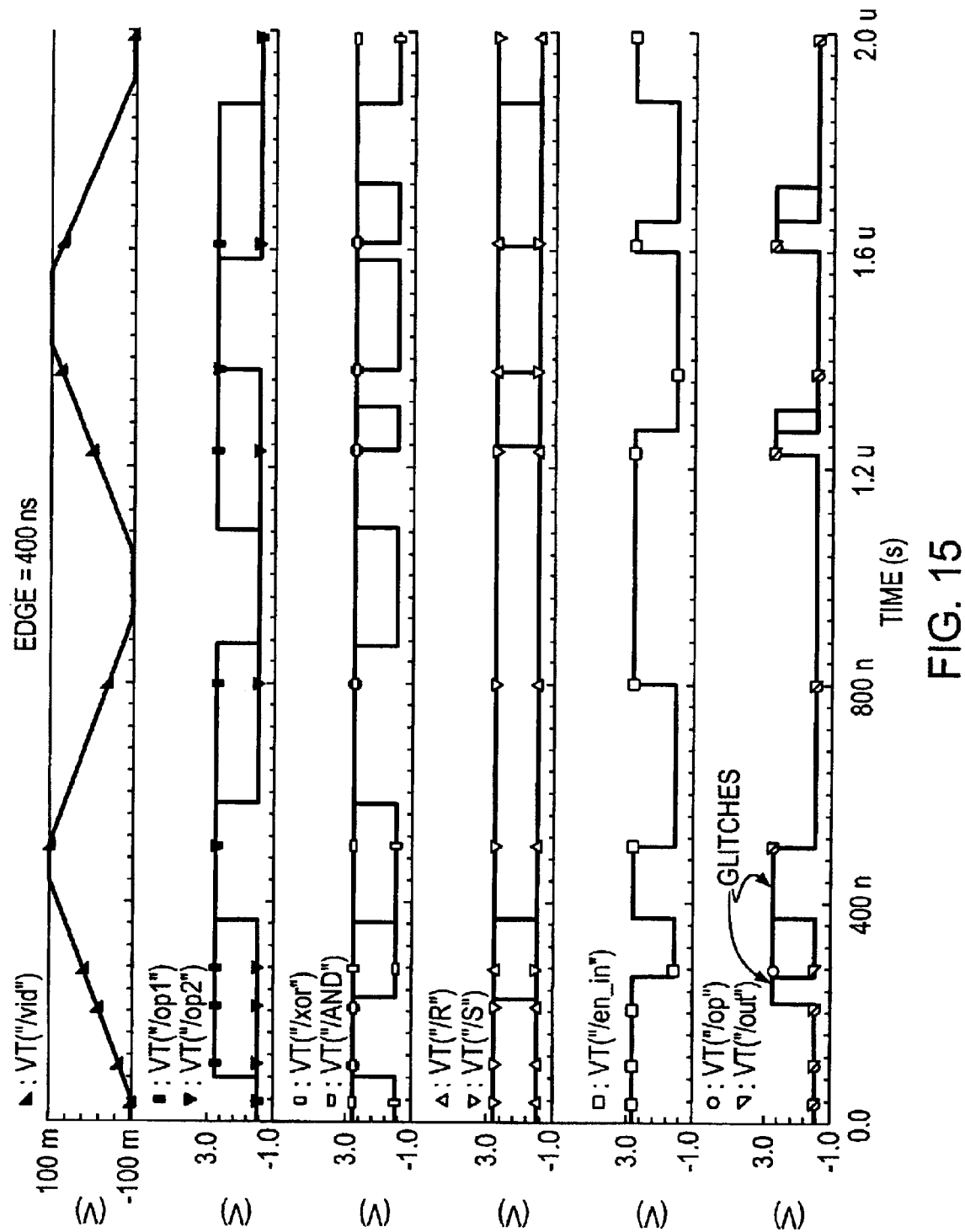

FIG. 13 shows the dependency of input voltage edge rate. Here rise and fall times are less than 1/BW (bandwidth). As shown this function equals 50 nS. FIG. 14 also shows the edge rate dependency, but where glitches have rise/fall time that exceed the 1/BW of the LSD (loss of signal detector). Note here the switch points of op1 and op2 and OUT. OUT switches a about Vid equaling 0. While op1 and op2 switches at the off-set values. A glitch in en__in that indicates that the low state of OUT is due to the fail safe operation during the glitch period of the present invention. The glitch occurs because T2−T1 is greater than 1/BW. So, the fail safe decision logic that is designed equal to the BW of the loss of signal detector starts responding to the incoming signal. FIG. 15 shows the glitches at an edge rate of the Vid of 400 ns.

As shown in FIGS. 13, 14, and 15 the edge transition rate of the Vid affects the fail safe circuit. The bandwidth of the amplifiers A1 and A2 of FIG. 4 depend on the edge times of the Vid signal. If the edges become slower than one over the bandwidth of A1 and A2 glitches will occur. Since a preferred bandwidth is 200 MHz, rise times slower than 50 nsec will cause these glitches.

The present invention can be used to advantage as data line receiver for differential signals commonly found in virtually all computing systems. Those systems would include at least those in communications, displays, computerized instruments, data gathering, and distributed systems.

Also, the preferred embodiment of FIG. 3 is a circuit that exhibits the logic functions shown in the FIG. 2. Since the logic of FIG. 2 may be implemented in various other circuits, including use of a computer to generate the proper logic states in response to measured input signal. Such circuit and system designs are well known in the art.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A fail safe differential receiver circuit wherein a fail safe condition includes loss in amplitude of the input differential signal and wherein signal frequency is lower than a defined limit, the circuit comprising:

a differential amplifier, two complementary auxiliary differential amplifiers, each auxiliary amplifier incorporating complementary offset voltages set to a value, wherein the input differential signal is connected to the differential inputs of the differential amplifier and of the two auxiliary amplifiers, a frequency detector that detects when the input differential signal is less than a frequency limit, a logic circuit that receives inputs from the frequency detector and the two auxiliary amplifiers, wherein the logic circuit determines that, when the differential signal amplitude is less than the value and the frequency is less than the frequency limit, the logic circuit fail safe condition is activated.

2. The fail safe circuit of claim 1 further comprising:
a time delay arranged for delaying the fail safe condition signal.

3. The fail safe circuit of claim 1 further comprising an initialization circuit that enables the fail safe circuit to operate.

4. The fail safe circuit of claim 1 wherein the auxiliary amplifiers have a frequency roll off at the signal frequency limit.

5. A computing system selected from the group consisting of computer communications systems, displays, computerized instruments, data gathering and distributed systems, the computing system comprising at least one fail safe differential receiver circuit as defined in claim 1.

6. A method for determining a fail safe condition in a differential receiver circuit wherein fail safe is defined as a loss in amplitude and frequency of the input differential signal with respect to defined thresholds, the method comprising the steps of:

comparing the amplitude of the input differential signal to a defined amplitude threshold, comparing the frequency of the input differential signal to a defined frequency threshold, logically determining that if the differential signal amplitude is less than the amplitude threshold, and if the frequency is less than the frequency threshold, then asserting a fail safe condition.

* * * * *